United States Patent
Mizutani et al.

(10) Patent No.: US 10,787,734 B2
(45) Date of Patent: Sep. 29, 2020

(54) VAPOR DEPOSITION DEVICE

(71) Applicant: AISIN SEIKI KABUSHIKI KAISHA, Kariya-shi (JP)

(72) Inventors: Kazuki Mizutani, Miyoshi (JP); Kosuke Katayama, Takahama (JP)

(73) Assignee: AISIN SEIKI KABUSHIKI KAISHA, Kariya-shi (JP)

(*) Notice: Subject to any disclaimer, the term of this patent is extended or adjusted under 35 U.S.C. 154(b) by 338 days.

(21) Appl. No.: 15/735,698

(22) PCT Filed: Jun. 21, 2016

(86) PCT No.: PCT/JP2016/068407
§ 371 (c)(1),
(2) Date: Dec. 12, 2017

(87) PCT Pub. No.: WO2017/010243
PCT Pub. Date: Jan. 19, 2017

(65) Prior Publication Data
US 2019/0264319 A1  Aug. 29, 2019

(30) Foreign Application Priority Data

Jul. 15, 2015  (JP) .................................. 2015-141357

(51) Int. Cl.
*C23C 14/24* (2006.01)
*C23C 14/54* (2006.01)
(Continued)

(52) U.S. Cl.
CPC .............. *C23C 14/24* (2013.01); *C23C 14/54* (2013.01); *C23C 14/56* (2013.01); *C23C 14/14* (2013.01)

(58) Field of Classification Search
CPC .................................................. C23C 14/243
See application file for complete search history.

(56) References Cited

U.S. PATENT DOCUMENTS 3,538,305 A * 11/1970 Grant ...................... C23C 14/26
392/388
4,054,500 A * 10/1977 Parent ..................... C23C 14/26
204/487

(Continued)

FOREIGN PATENT DOCUMENTS

JP          37-19517 Y      8/1962
JP          51-107285 A     9/1976
(Continued)

OTHER PUBLICATIONS

Combined Chinese Office Action and Search Report dated May 8, 2019, in Patent Application No. 201680041485.6, 14 pages (with English translation).

(Continued)

*Primary Examiner* — Joseph A Miller, Jr.
(74) *Attorney, Agent, or Firm* — Oblon, McClelland, Maier & Neustadt, L.L.P.

(57) ABSTRACT

A vapor deposition device includes: a retaining portion, which is configured to retain a substrate; a basket filament-type heater, which is formed of a linear heat-generating element, which is configured to generate heat through application of a current, and which includes an accommodating portion formed so as to allow a vapor deposition material to be accommodated by bending the linear heat-generating element, the filament-type heater being arranged so that the accommodating portion is positioned at a predetermined distance in a horizontal direction of the basket filament-type heater from the substrate retained on the retaining portion; and a reflective plate, which is arranged on a rear side of the vapor deposition material accommodated in the accommodating portion, when viewed from the substrate retained on the retaining portion, and which is constructed so as to receive heat from the basket filament-type heater.

3 Claims, 6 Drawing Sheets

(51) Int. Cl.
*C23C 14/56* (2006.01)
*C23C 14/14* (2006.01)

(56) References Cited

U.S. PATENT DOCUMENTS

| | | | | |
|---|---|---|---|---|
| 4,390,571 A | * | 6/1983 | Cosgrove | C23C 14/24 427/250 |
| 4,812,352 A | * | 3/1989 | Debe | C23C 14/12 428/142 |
| 5,679,410 A | | 10/1997 | Sugita et al. | |
| 2002/0017245 A1 | * | 2/2002 | Tsubaki | C23C 14/12 118/718 |
| 2002/0197418 A1 | * | 12/2002 | Mizukami | C23C 14/24 427/596 |
| 2003/0026601 A1 | * | 2/2003 | Jabbour | C23C 14/12 392/389 |
| 2009/0014316 A1 | * | 1/2009 | Mitchell | C23C 14/26 204/192.1 |

FOREIGN PATENT DOCUMENTS

| | | | |
|---|---|---|---|
| JP | 5-70932 A | 3/1993 |
| JP | 8-53763 A | 2/1996 |
| JP | 11-279746 A | 10/1999 |
| JP | 2008-138261 A | 6/2008 |
| JP | 2012-117114 A | 6/2012 |

OTHER PUBLICATIONS

International Search Report dated Sep. 6, 2016, in PCT/JP2016/068407 filed Jun. 21, 2016.

* cited by examiner

VAPOR DEPOSITION DEVICE

TECHNICAL FIELD

This disclosure relates to a vapor deposition device.

BACKGROUND DISCUSSION

A vapor deposition device to be used for forming a thin film on a surface of a substrate includes a retaining portion configured to retain the substrate and a heater configured to heat a solid vapor deposition material. When the vapor deposition material is heated with heat from the heater, vapor is generated from the vapor deposition material. The generated vapor is brought into contact with the surface (vapor deposition surface) of the substrate retained on the retaining portion and coagulated by being cooled with a contact region. Minute solid particles thus coagulated are uniformly vapor-deposited on the vapor deposition surface, to thereby form a thin film on the vapor deposition surface.

In each of Patent Literature 1 and Patent Literature 2, there is disclosed a vapor deposition device, which includes a reflective plate arranged so as to surround a space extending from a vapor deposition material to a substrate and which is constructed so that the reflective plate is heated. With the vapor deposition device described in each of Patent Literature 1 and Patent Literature 2, vapor evaporated from the vapor deposition material is brought into contact with the reflective plate. The vapor that has been brought into contact with the reflective plate is coagulated on the reflective plate to form solid particles. Those solid particles are re-evaporated by being heated on the reflective plate. The re-evaporated vapor is brought into contact with the vapor deposition surface of the substrate, and thus it is possible to improve the yield (vapor deposition efficiency) of the vapor deposition material.

CITATION LIST

Patent Literature

[PTL 1] JP 05-70932 A
[PTL 2] JP 08-53763 A

SUMMARY

Technical Problem

With the vapor deposition device disclosed in each of Patent Literature 1 and Patent Literature 2, the vapor deposition material is supplied to a heat-resistant container in which only an upper surface is opened. When the heat-resistant container is heated with a heater, the vapor deposition material in the heat-resistant container is heated, and then vapor is generated from the vapor deposition material. In this case, the upper surface of the heat-resistant container configured to accommodate the vapor deposition material is opened, and hence the vapor from the vapor deposition material basically travels upward. Therefore, the surface (vapor deposition surface) of the substrate, with which the vapor traveling upward is brought into contact, is formed in a direction perpendicular to a traveling direction of the vapor, that is, in parallel to a horizontal direction (lateral direction). A vapor deposition device in which the substrate is retained on the retaining portion so that the vapor deposition surface is formed in parallel to the horizontal direction as described above is called a horizontal vapor deposition device. Meanwhile, a vapor deposition device in which the substrate is retained on the retaining portion so that the vapor deposition surface is formed in parallel to a vertical direction is called a vertical vapor deposition device.

When a thin film is formed on the surface (vapor deposition surface) of the substrate through use of the vertical vapor deposition device, the substrate is retained on the retaining portion so that the vapor deposition surface is formed in parallel to the vertical direction, and hence the traveling direction of vapor that is brought into contact with the vapor deposition surface is a direction perpendicular to the vapor deposition surface, that is, the horizontal direction. In this case, in general, a filament-type heater is used as the heater configured to heat the vapor deposition material.

The filament-type heater is formed of a linear heat-generating element configured to generate heat through application of a current and includes an accommodating portion formed so as to be able to accommodate the vapor deposition material. When the filament-type heater generates heat, the vapor deposition material accommodated in the accommodating portion is heated, and thus vapor is generated from the vapor deposition material. The accommodating portion is formed by bending the linear heat-generating element. Therefore, a gap is formed between the linear heat-generating elements adjacent to each other, which form the accommodating portion. That is, a large number of gaps are formed in the accommodating portion. Therefore, when vapor is generated from the vapor deposition material accommodated in the accommodating portion through heat generation of the filament-type heater, the vapor passes through the gaps formed in the accommodating portion to travel in all directions.

As described above, through use of the filament-type heater, the vapor generated from the vapor deposition material is allowed to travel in all directions. Therefore, of the vapor that has traveled in all directions, the vapor that has traveled in the horizontal direction toward the substrate may be brought into contact with the vapor deposition surface to form a thin film on the vapor deposition surface.

However, when the filament-type heater is used, the vapor that has traveled in the direction toward the substrate when viewed from the vapor deposition material is brought into contact with the vapor deposition surface, whereas the vapor that has traveled in other directions is not brought into contact with the vapor deposition surface. That is, only the vapor traveling in a single direction contributes to vapor deposition, and the vapor traveling in the other directions does not contribute to vapor deposition. Thus, when the filament-type heater is used, there is a problem in that the yield of the vapor deposition material is extremely low.

It is an object of the present disclosure to provide a vapor deposition device using a filament-type heater constructed so that the yield of a vapor deposition material is improved.

Solution to Problem

According to one embodiment of the present disclosure, there is provided a vapor deposition device (1) including: a retaining portion (3), which is configured to retain a substrate (W); a filament-type heater (4, 4A), which is formed of a linear heat-generating element, which is configured to generate heat through application of a current, and which includes an accommodating portion (41, 41A) formed so as to allow a vapor deposition material to be accommodated by bending the linear heat-generating element, the filament-type heater (4, 4A) being arranged so that the accommodating portion is positioned at a predetermined distance in a horizontal direction of the filament-type heater from the substrate retained on the retaining portion; and a reflective plate (6A, 6B, 6C, 6D, 6E), which is arranged on a rear side of the vapor deposition material accommodated in the accommodating portion, when viewed from the substrate retained on the retaining portion, and which is constructed so as to receive heat from the filament-type heater.

According to the present disclosure, when the filament-type heater generates heat through application of a current to the filament-type heater, the heat is transmitted to the vapor deposition material accommodated in the accommodating portion of the filament-type heater. Therefore, the vapor deposition material is heated, and then vapor is generated from the vapor deposition material. The vapor travels in all directions, but the vapor traveling in a direction toward the substrate retained on the retaining portion, when viewed from the vapor deposition material, is brought into contact with a vapor deposition surface of the substrate and coagulated in a contact region. Further, of the vapor traveling in all directions, the vapor traveling in a direction opposite to the direction toward the substrate retained on the retaining portion, when viewed from the vapor deposition material, is brought into contact with the reflective plate arranged on the rear side of the vapor deposition material when viewed from the substrate retained on the retaining portion. The reflective plate is heated when the heat from the filament-type heater is transmitted thereto, and hence the vapor that has been brought into contact with the reflective plate is not coagulated on the reflective plate. Alternatively, even when the vapor is temporarily coagulated on the reflective plate, the coagulated solid particles are re-evaporated on the heat of the reflective plate. Therefore, the vapor that has been brought into contact with the reflective plate is reflected from or re-evaporated on the reflective plate to invert a traveling direction thereof, and travels to the substrate. Then, the vapor is brought into contact with the vapor deposition surface of the substrate, and coagulated in a contact region.

That is, according to the present disclosure, of the vapor generated from the vapor deposition material, the vapor traveling in the direction toward the substrate and the vapor traveling in the direction opposite to the direction toward the substrate each contribute to vapor deposition on the vapor deposition surface. As described above, the vapor traveling in a plurality of directions from the vapor deposition material contributes to vapor deposition, and hence the yield of the vapor deposition material when the filament-type heater is used can be improved.

In the present disclosure, it is preferred that the reflective plate (6A) be arranged in the accommodating portion. In this case, the reflective plate is arranged in the accommodating portion at a position on the rear side of the vapor deposition material accommodated in the accommodating portion when viewed from the substrate retained on the retaining portion. Further, it is preferred that the accommodating portion (41) be formed into a conical shape having a contour that is protruded downward by winding the linear heat-generating element into a helical shape. It is preferred that the reflective plate (6A) be formed into a semi-conical shape and arranged in the accommodating portion so as to be protruded downward. With the above-mentioned configuration, the reflective plate is arranged in the accommodating portion of the filament-type heater, and hence the heat from the filament-type heater can be easily transmitted to the reflective plate. Further, the reflective plate can be retained at a position on the rear side of the vapor deposition material by being arranged in the accommodating portion, and hence a retaining member or the like configured to retain the reflective plate at a predetermined position is not separately required. As a result, the vapor deposition device according to the present disclosure can be constructed more simply.

Further, the reflective plate (6B, 6C, 6D, 6E) may include a rear surface plate (61B, 61C, 61D, 61E) arranged on a rear side of the accommodating portion when viewed from the substrate retained on the retaining portion. In this case, it is preferred that the reflective plate further include a connecting part (62B, 62C, 62D, 62E) configured to connect the rear surface plate and the filament-type heater to each other so that the rear surface plate is retained by the accommodating portion, and the heat from the filament-type heater is transmitted to the rear surface plate. With this, of the vapor from the vapor deposition material accommodated in the accommodating portion, the vapor traveling in the direction opposite to the direction toward the substrate is caused to be reflected from the rear surface plate arranged on the rear side of the accommodating portion or re-evaporated on the reflective plate to travel in the direction toward the substrate, with the result that the yield of the vapor deposition material can be improved.

Further, it is preferred that the reflective plate (6D) include an upper plate (63D) arranged on an upper side of the accommodating portion and a lower plate (64D) arranged on a lower side of the accommodating portion. With this, of the vapor generated from the vapor deposition material in the accommodating portion of the filament-type heater to travel in all directions, the vapor traveling upward from the accommodating portion and the vapor traveling downward from the accommodating portion are caused to be reflected from the upper plate and the lower plate or re-evaporated on the upper plate and the lower plate to travel in the direction toward the substrate, with the result that the yield of the vapor deposition material can be improved.

DETAILED DESCRIPTION

First Embodiment

Figure 1:
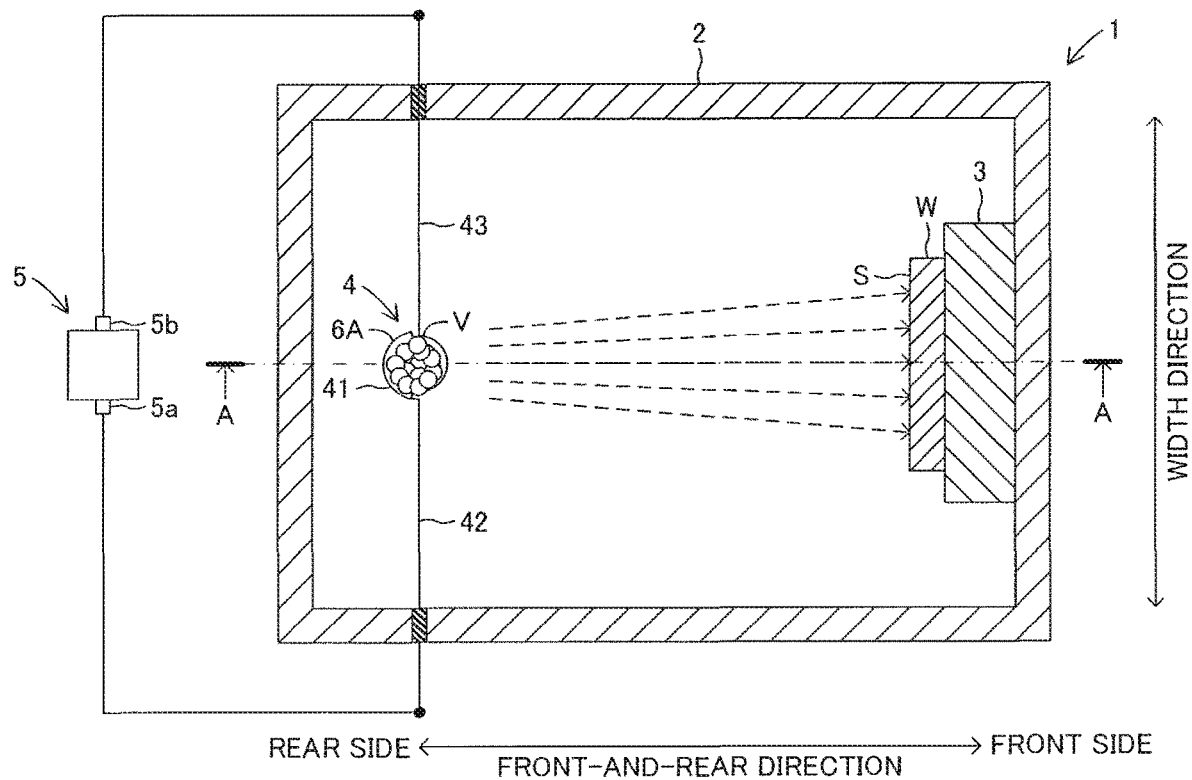
FIG. 1 is a schematic sectional view of a vertical vapor deposition device when viewed from a planar direction.
Figure 2:
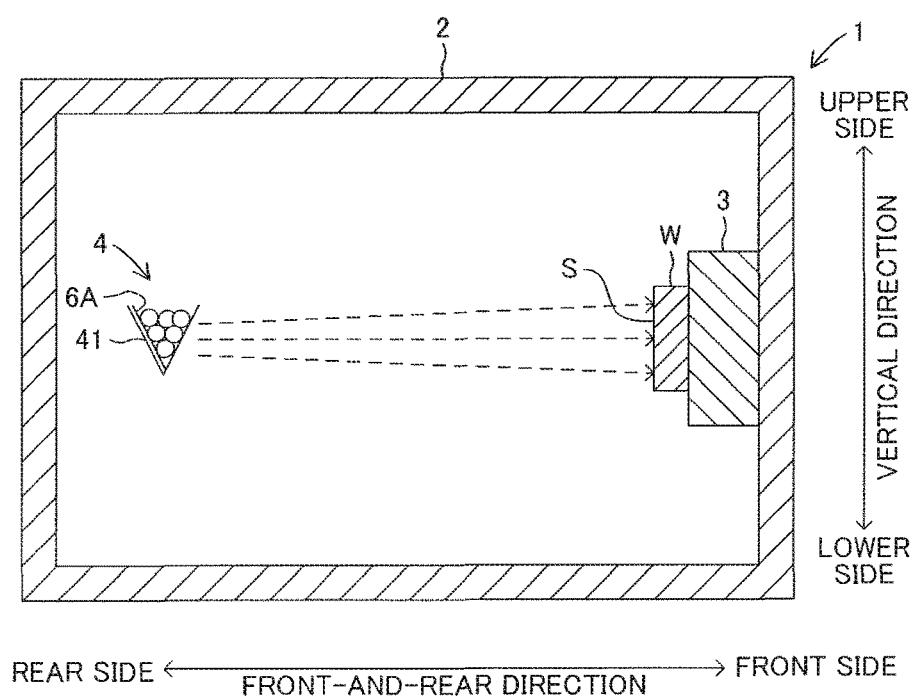
FIG. 2 is a sectional view taken along the line A-A of FIG. 1.

Now, a vapor deposition device according to an embodiment of the present disclosure is described with reference to the accompanying drawings. FIG. 1 is a schematic sectional view of a vertical vapor deposition device 1 according to a first embodiment of the present disclosure when viewed from a planar direction. FIG. 2 is a sectional view taken along the line A-A of FIG. 1. FIG. 2 is a schematic sectional view of the vertical vapor deposition device 1 according to the first embodiment when viewed from a side surface direction thereof. In FIG. 1 and FIG. 2, the right-and-left direction is defined as a front-and-rear direction, with the right side being defined as a front side and the left side being defined as a rear side. Further, in FIG. 1, the up-and-down direction is defined as a width direction. Further, the up-and-down direction of FIG. 2 is a vertical direction (gravity direction). The front-and-rear direction and the width direction are perpendicular to the vertical direction, that is, correspond to a horizontal direction. In the following description, the directions used for describing a vapor deposition device and each component included in the vapor deposition device are defined as described above. As illustrated in FIG. 1, the vertical vapor deposition device 1 includes a vacuum tank 2, a retaining portion 3, a basket filament-type heater 4, and a power supply 5.

The vacuum tank 2 is a housing having a space inside. The retaining portion 3 and the basket filament-type heater 4 are arranged in the vacuum tank 2. The vacuum tank 2 is constructed so that the inner space thereof can be set to a high-vacuum state.

The retaining portion 3 is arranged at a predetermined position in the vacuum tank 2. A substrate W is retained on the retaining portion 3. The substrate W has a vapor deposition surface S on which a thin film is to be formed. When the substrate W is retained on the retaining portion 3, the vapor deposition surface S is formed along the vertical direction as illustrated in FIG. 2. That is, the substrate W is retained on the retaining portion 3 so that the vapor deposition surface S is formed in parallel to the vertical direction, that is, the vapor deposition surface S is perpendicular to the horizontal direction (front-and-rear direction), in other words, the normal direction of the vapor deposition surface S corresponds to the horizontal direction.

Figure 3:
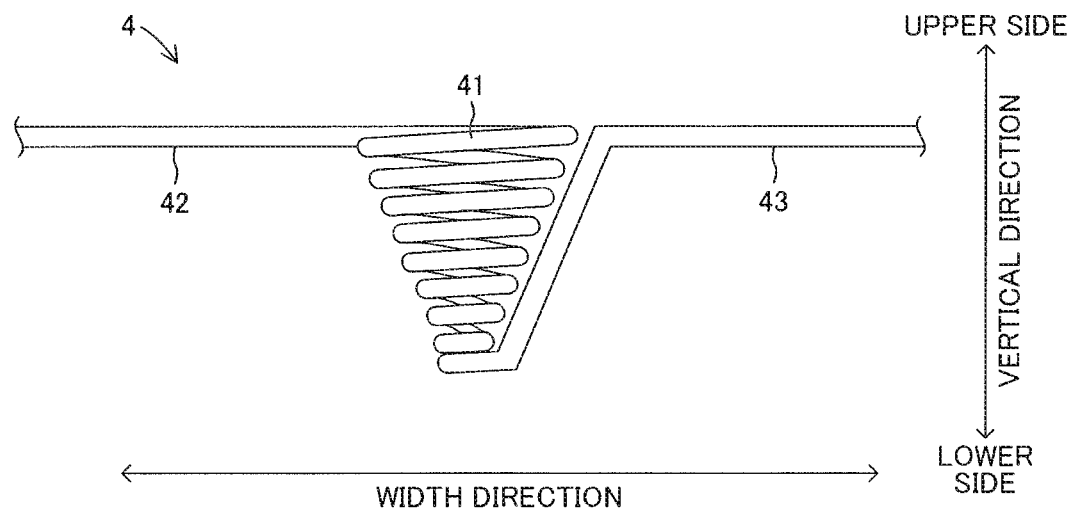
FIG. 3 is a front view of a basket filament-type heater when viewed from a right side of FIG. 2.

The basket filament-type heater 4 is formed of a linear heat-generating element, and generates heat through application of a current. As the heat-generating element, tungsten is typically used. FIG. 3 is a front view of the basket filament-type heater 4 arranged in the vacuum tank 2 when viewed from the right side (front side) of FIG. 2. As illustrated in FIG. 3, the basket filament-type heater 4 includes an accommodating portion 41, a first straight-line portion 42, and a second straight-line portion 43, and is formed of one linear heat-generating element.

The accommodating portion 41 is formed by bending the linear heat-generating element. In the first embodiment, the accommodating portion 41 is formed into a conical shape having a contour that is protruded downward by winding the linear heat-generating element into a helical shape (more specifically, a conical spiral shape). The accommodating portion 41 of the basket filament-type heater 4 thus formed exhibits a shape like a goal net hung on a basket goal ring.

An end portion of the linear heat-generating element positioned in an upper end portion of the accommodating portion 41 formed into a conical shape that is protruded downward is connected to one end portion of the first straight-line portion 42 formed into a straight line shape. Further, an end portion of the linear heat-generating element positioned in a lower end portion of the accommodating portion 41 is connected to one end portion of the second straight-line portion 43 formed into a straight line shape. The first straight-line portion 42 and the second straight-line portion 43 each extend in opposite directions from connected positions to the accommodating portion 41. Thus, as illustrated in FIG. 1, the accommodating portion 41 is arranged in the vacuum tank 2 so as to be formed into a conical shape that is protruded downward under a state of being hung between the first straight-line portion 42 and the second straight-line portion 43. In this case, the accommodating portion 41 is positioned in the vacuum tank 2 at a predetermined distance in the horizontal direction (front-and-rear direction) apart from the substrate W retained on the retaining portion 3. In FIG. 2, the accommodating portion 41 is positioned at a predetermined distance on the rear side apart from the vapor deposition surface S of the substrate W retained on the retaining portion 3. In other words, the basket filament-type heater 4 is arranged in the vacuum tank 2 so that the accommodating portion 41 is positioned at a predetermined distance in the horizontal direction (on the rear side) apart from the substrate W retained on the retaining portion 3.

The other end portion side of the first straight-line portion 42 and the other end portion side of the second straight-line portion 43 are each drawn outside from the vacuum tank 2 as illustrated in FIG. 1, and connected to the power supply 5 arranged outside of the vacuum tank 2. The power supply 5 has a positive terminal 5a and a negative terminal 5b. The other end portion of the first straight-line portion 42 is connected to the positive terminal 5a of the power supply 5, and the other end portion of the second straight-line portion 43 is connected to the negative terminal 5b of the power supply 5.

Figure 4:
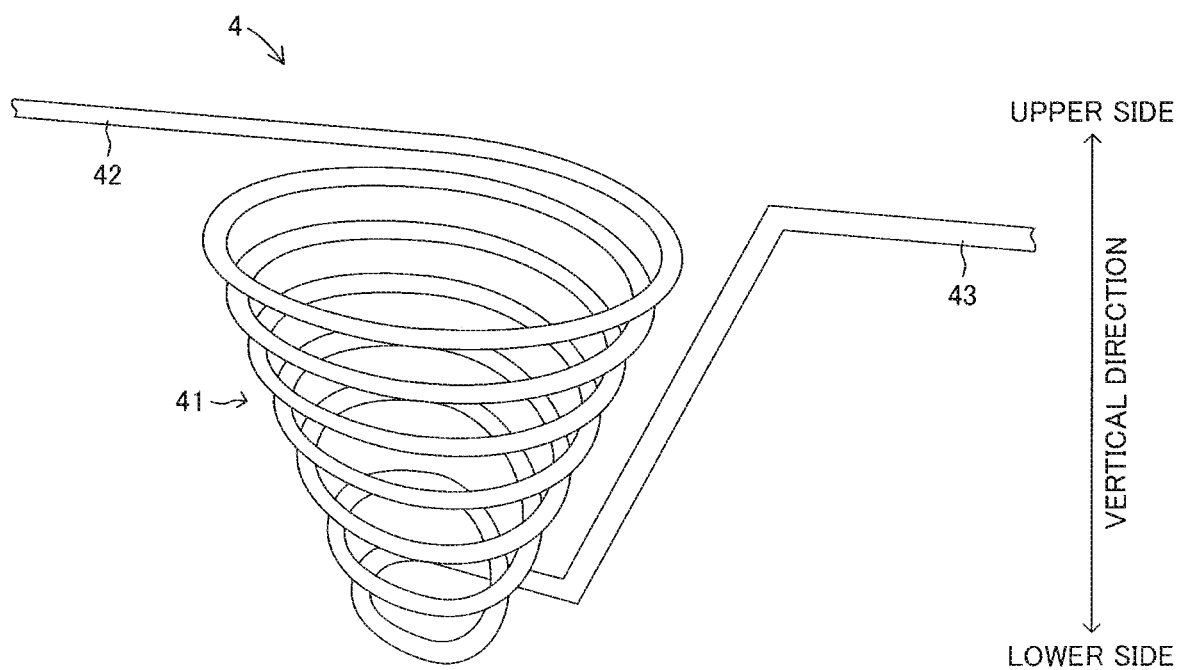
FIG. 4 is a perspective view of the basket filament-type heater.

FIG. 4 is a schematic perspective view of the basket filament-type heater 4. As illustrated in FIG. 4, the linear heat-generating element forming the accommodating portion 41 of the basket filament-type heater 4 is wound into a conical spiral shape so that the diameter is reduced toward a lower portion. The linear heat-generating element forming the accommodating portion 41 forms only a framework of a side peripheral surface of the accommodating portion 41, and hence gaps are formed on all over the side peripheral surface of the accommodating portion 41. Specifically, the gaps are formed between adjacent windings along the vertical direction. Further, a large opening is formed on an upper surface side of the accommodating portion 41, and a small opening is formed on a lower surface side thereof.

A solid vapor deposition material V is accommodated in the accommodating portion 41 of the basket filament-type heater 4. In other words, the accommodating portion 41 is formed so as to allow the vapor deposition material V to be accommodated by winding the linear heat-generating element into a helical shape (conical spiral shape). The vapor deposition material V is a material for a thin film to be formed on the vapor deposition surface S of the substrate W. There is no particular limitation on the vapor deposition material V as long as the vapor deposition material V can be vapor-deposited on the vapor deposition surface S of the substrate W by a resistance heating-type vapor deposition method. Examples of the vapor deposition material may include metals commonly used as a resistance heating-type vapor deposition material, such as indium (In), tin (Sn), aluminum (Al), copper (Cu), silver (Ag), gold (Au), iron (Fe), nickel (Ni), chromium (Cr), lead (Pb), zinc (Zn), silicon (Si), lithium (Li), and cobalt (Co), metal oxides, such as chromium oxide ($Cr_2O_3$) and zinc oxide (ZnO), or alloys thereof, fluorides, such as aluminum fluoride ($AlF_3$), calcium fluoride ($CaF_2$), cerium fluoride ($CeF_3$), gadolinium fluoride ($GdF_3$), lanthanum fluoride ($LaF_3$), lithium fluoride (LiF), magnesium fluoride ($MgF_2$), sodium fluoride (NaF), neodymium fluoride ($NdF_3$), and yttrium fluoride ($YF_3$), and sulfides, such as zinc sulfide (ZnS).

It is appropriate that the vapor deposition material V be formed into a bulk shape, a pellet shape, or a particle shape so as to be capable of being accommodated in the accommodating portion 41. Further, it is appropriate that the vapor deposition material V have such a size as not to fall through the gaps of the accommodating portion 41 when being accommodated in the accommodating portion 41.

Figure 5:
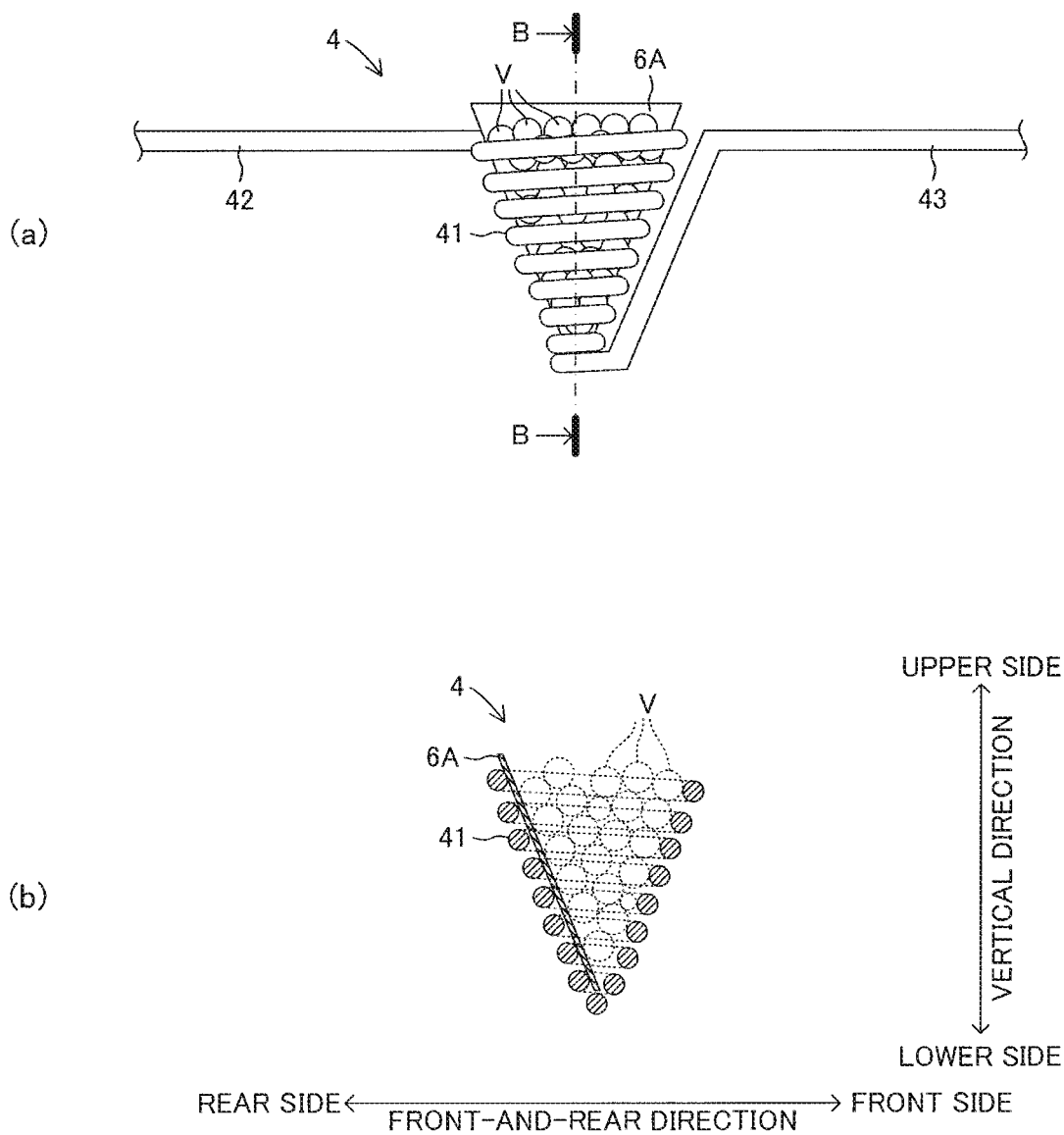
FIG. 5 are each views for illustrating the basket filament-type heater under a state in which a vapor deposition material is accommodated in an accommodating portion and a reflective plate of a first embodiment of the present disclosure is arranged therein.

Further, a reflective plate 6A is arranged in the accommodating portion 41 in addition to the vapor deposition material V accommodated therein. FIG. 5 are each views for illustrating the basket filament-type heater 4 under a state in which the vapor deposition material V is accommodated in the accommodating portion 41 and the reflective plate 6A is arranged therein. FIG. 5(a) is a front view of the basket filament-type heater 4 when viewed from the front side, and FIG. 5(b) is a sectional view taken along the line B-B of FIG. 5(a). In FIG. 5(b), the right-and-left direction corresponds to a front-and-rear direction of the basket filament-type heater 4, with the right side being a front side and the left side being a rear side. In FIG. 5(b), the vapor deposition material V accommodated in the accommodating portion 41 is represented by the broken line.

As is well illustrated in FIG. 5(b), the reflective plate 6A is arranged on the rear side of the vapor deposition material V in the accommodating portion 41. In this case, as illustrated in FIG. 2, the substrate W retained on the retaining portion 3 is arranged on the front side of the accommodating portion 41. That is, when viewed from the substrate W retained on the retaining portion 3, the reflective plate 6A is arranged on the rear side of the vapor deposition material V in the accommodating portion 41.

As is understood from FIG. 5(b), in the accommodating portion 41, the reflective plate 6A is in contact with the linear heat-generating element forming the accommodating portion 41. Therefore, when the basket filament-type heater 4 generates heat, the heat from the basket filament-type heater 4 is transmitted to the reflective plate 6A.

Figure 6:
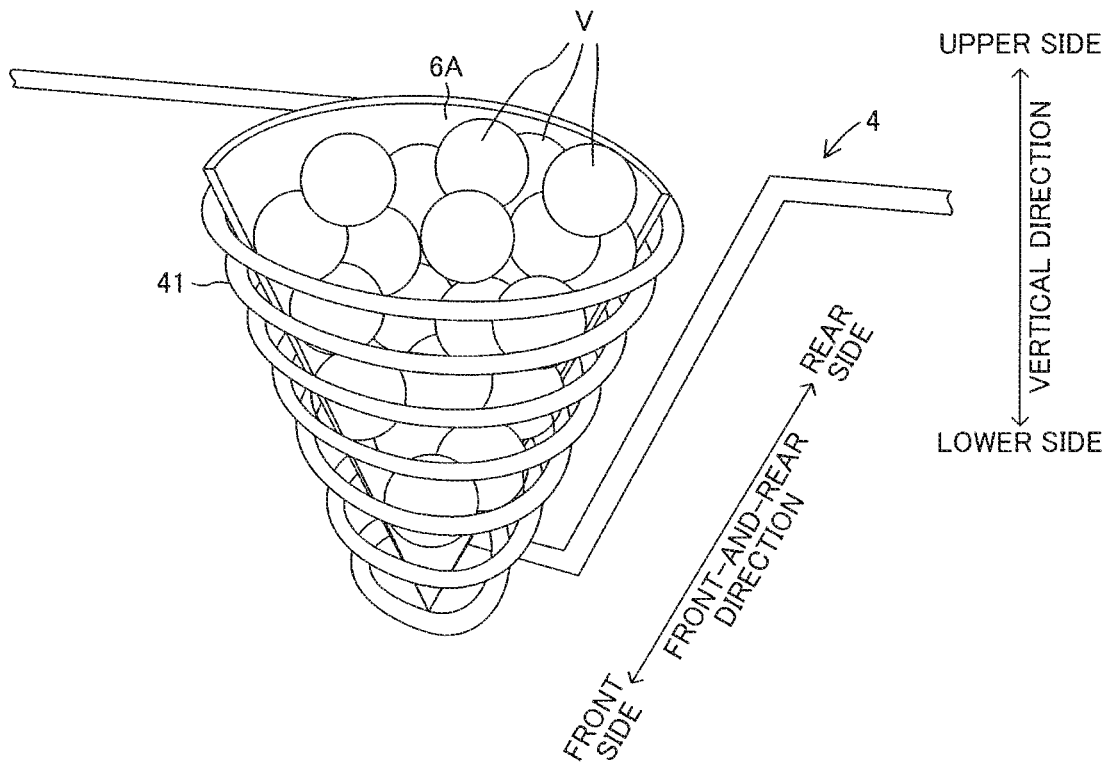
FIG. 6 is a perspective view of the basket filament-type heater for illustrating a state in which the vapor deposition material is accommodated in the accommodating portion and the reflective plate of the first embodiment is arranged therein.
Figure 7:
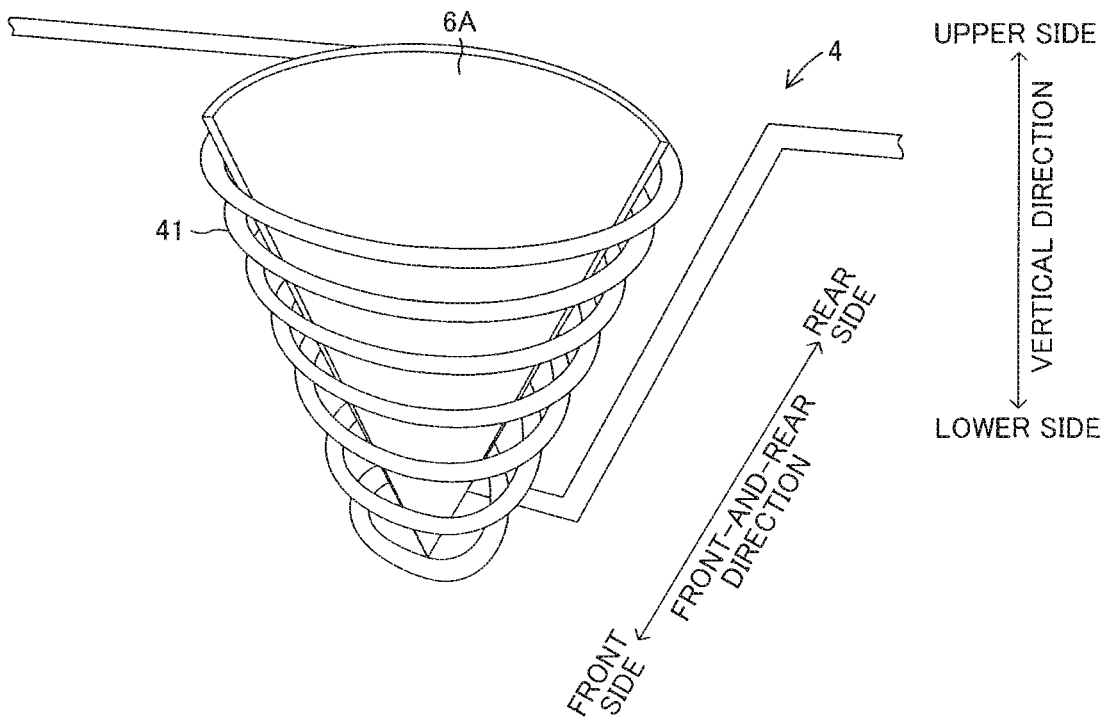
FIG. 7 is a perspective view of the basket filament-type heater for illustrating a state in which the vapor deposition material is removed from FIG. 6.

FIG. 6 is a schematic perspective view of the basket filament-type heater 4 for illustrating a state in which the vapor deposition material V is accommodated in the accommodating portion 41 and the reflective plate 6A is arranged therein. Further, FIG. 7 is a schematic perspective view of the basket filament-type heater 4 for illustrating a state in which the vapor deposition material V is removed from FIG. 6. As is understood from FIG. 6 and FIG. 7, the reflective plate 6A is formed into a semi-conical shape so as to be along the side peripheral surface of the conical accommodating portion 41 and arranged in the accommodating portion 41 so as to be protruded downward. In this case, the reflective plate 6A is arranged in the accommodating portion 41 so as to be brought into contact with the linear heat-generating element forming, of the side peripheral surface of the accommodating portion 41, a side peripheral surface on the rear side. With this, the reflective plate 6A is arranged in the accommodating portion 41 so as to cover the vapor deposition material V accommodated in the accommodating portion 41 from the rear side in the accommodating portion 41.

The reflective plate 6A is formed of a material that is not melted with the heat from the basket filament-type heater 4. Examples of the material for the reflective plate 6A may include tungsten (W), tantalum (Ta), molybdenum (Mo), a molybdenum-lanthanum alloy (Mo—La), platinum (Pt), and nichrome (Ni—Cr). Of those, molybdenum, tungsten, and tantalum are preferred as the material for the reflective plate 6A.

Next, description is given of a procedure for forming a thin film on the vapor deposition surface S of the substrate W through use of the vertical vapor deposition device 1 having the above-mentioned configuration. First, the substrate W is retained on the retaining portion 3 arranged in the vacuum tank 2. Then, the reflective plate 6A is arranged in the accommodating portion 41 of the basket filament-type heater 4 arranged in the vacuum tank 2. In this case, the reflective plate 6A is arranged in the accommodating portion 41 so as to cover, of the side peripheral surface of the accommodating portion 41, a half side surface forming the rear portion. After that, the vapor deposition material V is accommodated in the accommodating portion 41. With this, the reflective plate 6A is arranged on the rear side of the vapor deposition material V in the accommodating portion 41.

Next, the vacuum tank 2 is exhausted to be set to a high-vacuum state. After that, the power supply 5 is operated. Then, the basket filament-type heater 4 generates heat through application of a current to the basket filament-type heater 4. With this, the vapor deposition material V and the reflective plate 6A in the accommodating portion 41 of the basket filament-type heater 4 are heated.

The vapor deposition material V in the accommodating portion 41 is evaporated by being heated. Therefore, vapor is generated from the vapor deposition material V. The generated vapor travels in all directions through the gaps formed on the side peripheral surface, an upper opening, and a lower opening of the accommodating portion 41. Of the vapor that has traveled in all directions, the vapor that has traveled forward, that is, the vapor that has traveled in a direction toward the substrate W retained on the retaining portion 3, is directly brought into contact with the vapor deposition surface S of the substrate W. Then, the vapor is cooled with the vapor deposition surface S and coagulated at that position.

Further, of the vapor that has traveled in all directions, the vapor that has traveled backward is brought into contact with the reflective plate 6A. In this case, the reflective plate 6A is heated with the heat from the basket filament-type heater 4, and hence the vapor that has been brought into contact with the reflective plate 6A is reflected from the reflective plate 6A without being cooled. Alternatively, the vapor that has been brought into contact with the reflective plate 6A is temporarily coagulated on the reflective plate 6A, and then re-evaporated with the heat of the reflective plate 6A. The vapor that has been reflected or re-evaporated inverts a traveling direction thereof and travels forward. Then, the vapor is brought into contact with the vapor deposition surface S of the substrate W and cooled with the vapor deposition surface S to be coagulated at that position.

Minute solid particles that have been coagulated on the vapor deposition surface S are uniformly vapor-deposited on the vapor deposition surface S, to thereby form a thin film on the vapor deposition surface S.

As described above, according to the first embodiment, of the vapor generated from the vapor deposition material V, the vapor traveling in the (forward) direction toward the substrate and the vapor traveling in the (backward) direction opposite to the direction toward the substrate contribute to vapor deposition on the vapor deposition surface S of the substrate W. That is, the vapor traveling in a plurality of directions contributes to vapor deposition. As a result, the yield of the vapor deposition material can be improved.

Further, according to the first embodiment, the reflective plate 6A is arranged in the accommodating portion 41 of the basket filament-type heater 4. Therefore, the reflective plate 6A can easily be heated with the heat from the basket filament-type heater 4. Further, the reflective plate 6A can be retained at a position on the rear side of the vapor deposition material by being arranged in the accommodating portion 41, and hence a retaining member or the like, which is configured to retain the reflective plate is not separately required. As a result, the vertical vapor deposition device 1 can be constructed more simply.

Second Embodiment

Next, a vapor deposition device according to a second embodiment of the present disclosure is described. The vapor deposition device according to the second embodiment is different from that of the first embodiment described above only in the arrangement and shape of the reflective plate, and the other configuration of the vapor deposition device according to the second embodiment is the same as that of the first embodiment described above. Therefore, in the following, only the arrangement and shape of the reflective plate are described, and description of the other configuration is omitted.

Figure 8:
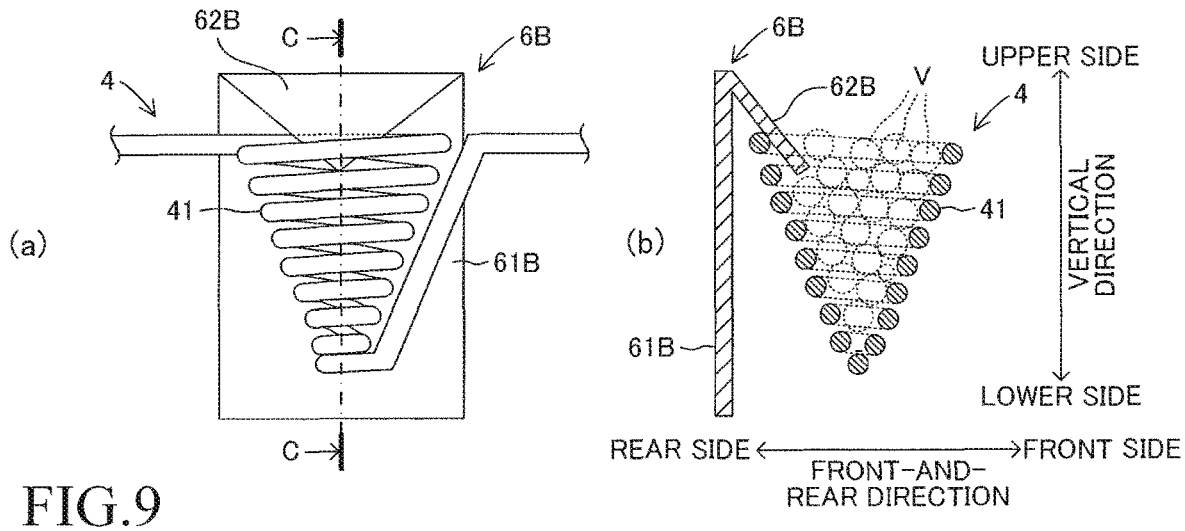
FIG. 8 are each views for illustrating the basket filament-type heater having a reflective plate of a second embodiment of the present disclosure mounted thereon.

FIG. 8 are each views for illustrating the basket filament-type heater 4 having a reflective plate 6B of the second embodiment mounted thereon. FIG. 8(a) is a front view of the basket filament-type heater 4 when viewed from the front side, and FIG. 8(b) is a sectional view taken along the line C-C of FIG. 8(a). In FIG. 8(b), the right-and-left direction corresponds to the front-and-rear direction of the basket filament-type heater 4, with the right side being the front side and the left side being the rear side. As illustrated in FIG. 8, the reflective plate 6B of the second embodiment includes a rear surface plate 61B and a connecting part 62B. The rear surface plate 61B is arranged on the rear side of the accommodating portion 41 of the basket filament-type heater 4 instead of being arranged in the accommodating portion 41. The rear surface plate 61B has a flat plate shape and exhibits a rectangular shape in front view. Further, the connecting part 62B is coupled to an upper end of the rear surface plate 61B. The connecting part 62B is inclined to extend diagonally forward and downward from the upper end of the rear surface plate 61B, and a contour thereof has a triangular shape when viewed from the direction of FIG. 8(a).

Further, as is well illustrated in FIG. 8(b), a distal end portion of the connecting part 62B is hung on the linear heat-generating element forming the accommodating portion 41 of the basket filament-type heater 4 from above. When the connecting part 62B is hung on the accommodating portion 41, the rear surface plate 61B is connected to the basket filament-type heater 4 through intermediation of the connecting part 62B. Therefore, the rear surface plate 61B is supported by the accommodating portion 41 under a state of being arranged at a position on the rear side of the accommodating portion 41, and the heat from the basket filament-type heater 4 is transmitted to the rear surface plate 61B through the connecting part 62B. In FIG. 8(b), the vapor deposition material V accommodated in the accommodating portion 41 is represented by the broken line.

In the vertical vapor deposition device 1 including the reflective plate 6B having the above-mentioned configuration, when the basket filament-type heater 4 is caused to generate heat to heat the vapor deposition material V in the accommodating portion 41, vapor is generated from the vapor deposition material V in the accommodating portion 41. Of the generated vapor, the vapor that has traveled forward is brought into contact with the vapor deposition surface S of the substrate W. The vapor is cooled with the vapor deposition surface S and coagulated at that position. Further, the vapor that has traveled backward is brought into contact with the rear surface plate 61B of the reflective plate 6B arranged on the rear side of the accommodating portion 41. In this case, the rear surface plate 61B is connected to the basket filament-type heater 4 through intermediation of the connecting portion 62B, and hence is heated with the heat transmitted from the basket filament-type heater 4. Therefore, the vapor that has been brought into contact with the rear surface plate 61B is reflected from the rear surface plate 61B without being coagulated, or is re-evaporated after being temporarily coagulated on the rear surface plate 61B. The vapor that has been reflected or re-evaporated inverts the traveling direction thereof and travels forward. Then, the vapor is brought into contact with the vapor deposition surface S of the substrate W and cooled with the vapor deposition surface S to be coagulated at that position. Minute solid particles that have been coagulated on the vapor deposition surface S are uniformly vapor-deposited on the vapor deposition surface S, to thereby form a thin film on the vapor deposition surface S.

As described above, also in the second embodiment, of the vapor generated from the vapor deposition material V, the vapor traveling in the (forward) direction toward the substrate and the vapor traveling in the (backward) direction opposite to the direction toward the substrate contribute to vapor deposition on the vapor deposition surface S of the substrate W. That is, the vapor traveling in a plurality of directions contributes to vapor deposition. As a result, the yield of the vapor deposition material can be improved.

Third Embodiment

Next, a vapor deposition device according to a third embodiment of the present disclosure is described. Similarly to the vapor deposition device according to the second embodiment, the vapor deposition device according to the third embodiment is different from that of the first embodiment described above only in the arrangement and shape of the reflective plate, and the other configuration of the vapor deposition device according to the third embodiment is the same as that of the first embodiment described above. Therefore, only the arrangement and shape of the reflective plate are described, and description of the other configuration is omitted.

Figure 9:
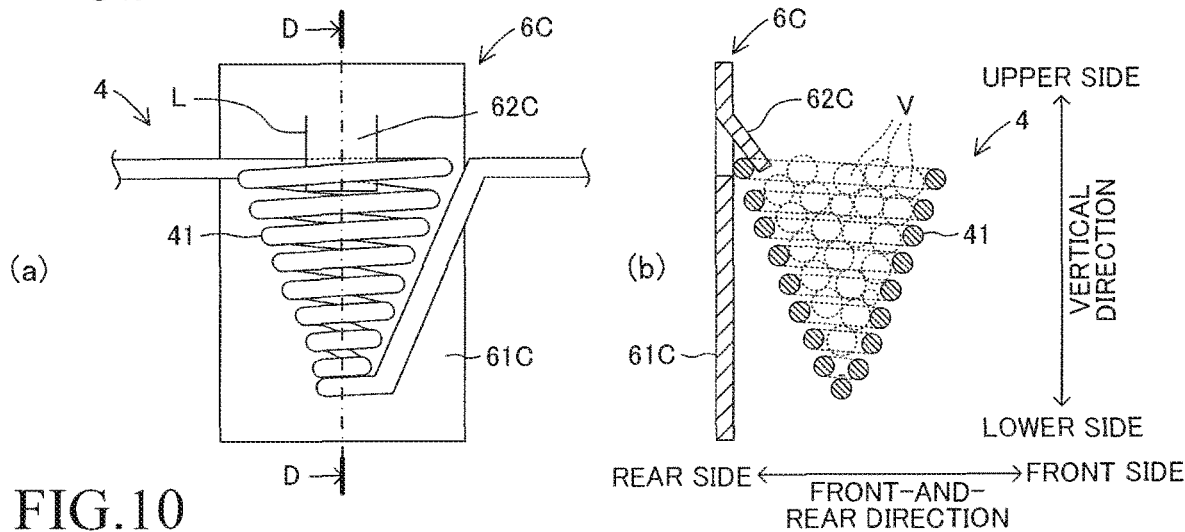
FIG. 9 are each views for illustrating the basket filament-type heater having a reflective plate of a third embodiment of the present disclosure mounted thereon.

FIG. 9 are each views for illustrating the basket filament-type heater 4 having a reflective plate 6C of the third embodiment mounted thereon. FIG. 9(a) is a front view of the basket filament-type heater 4 when viewed from the front side, and FIG. 9(b) is a sectional view taken along the line D-D of FIG. 9(a). In FIG. 9(b), the right-and-left direction corresponds to the front-and-rear direction of the basket filament-type heater 4, with the right side being the front side and the left side being the rear side. As illustrated in FIG. 9, the reflective plate 6C of the third embodiment includes a rear surface plate 61C and a connecting part 62C similarly to the reflective plate 6B of the second embodiment. The rear surface plate 61C is arranged on the rear side of the accommodating portion 41. The rear surface plate 61C has a flat plate shape and exhibits a rectangular shape in front view. Further, the rear surface plate 61C partially has a cutout L, and a portion cut out through the cutout L is pushed out forward to form the connecting part 62C.

As illustrated in FIG. 9(*b*), the connecting part 62C is inclined to extend diagonally forward and downward from the rear surface plate 61C, and a distal end portion thereof is hung on the linear heat-generating element forming the accommodating portion 41 of the basket filament-type heater 4 from above. When the connecting part 62C is hung on the accommodating part 41, the rear surface plate 61C is connected to the basket filament-type heater 4 through intermediation of the connecting part 62C. Therefore, the rear surface plate 61C is supported by the accommodating portion 41 under a state of being arranged at a position on the rear side of the accommodating portion 41, and the heat from the basket filament-type heater 4 is transmitted to the rear surface plate 61C through the connecting part 62C. In FIG. 9(*b*), the vapor deposition material V accommodated in the accommodating portion 41 is represented by the broken line.

Similarly to the second embodiment, in the third embodiment, of the vapor generated from the vapor deposition material V, the vapor traveling in the (forward) direction toward the substrate and the vapor traveling in the (backward) direction opposite to the direction toward the substrate contribute to vapor deposition on the vapor deposition surface S of the substrate W. That is, the vapor traveling in a plurality of directions contributes to vapor deposition. As a result, the yield of the vapor deposition material can be improved.

Fourth Embodiment

Next, a vapor deposition device according to a fourth embodiment of the present disclosure is described. Similarly to the vapor deposition devices according to the second embodiment and the third embodiment, the vapor deposition device according to the fourth embodiment is different from that of the first embodiment described above only in the arrangement and shape of the reflective plate, and the other configuration of the vapor deposition device according to the fourth embodiment is the same as that of the first embodiment described above. Therefore, only the arrangement and shape of the reflective plate are described, and description of the other configuration is omitted.

Figure 10:
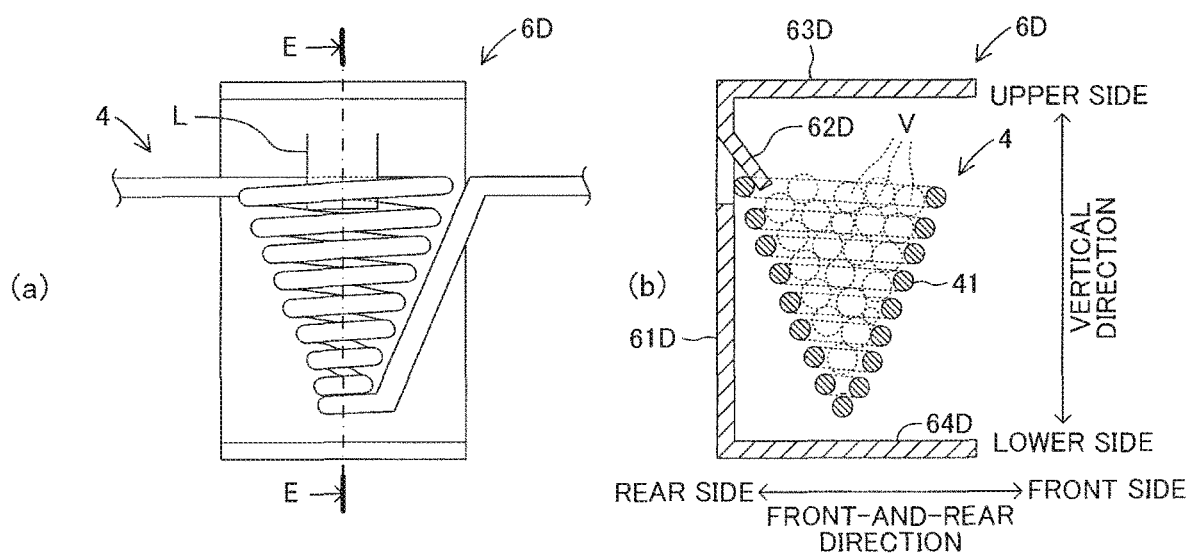
FIG. 10 are each views for illustrating the basket filament-type heater having a reflective plate of a fourth embodiment of the present disclosure mounted thereon.

FIG. 10 are each views for illustrating the basket filament-type heater 4 having a reflective plate 6D of the fourth embodiment mounted thereon. FIG. 10(*a*) is a front view of the basket filament-type heater 4 when viewed from the front side, and FIG. 10(*b*) is a sectional view taken along the line E-E of FIG. 10(*a*). In FIG. 10(*b*), the right-and-left direction corresponds to the front-and-rear direction of the basket filament-type heater 4, with the right side being the front side and the left side being the rear side. As illustrated in FIG. 10, the reflective plate 6D of the fourth embodiment includes a rear surface plate 61D, a connecting portion 62D, an upper plate 63D, and a lower plate 64D.

The rear surface plate 61D is arranged on the rear side of the accommodating portion 41 in the same manner as in the rear surface plate 61B according to the second embodiment and the rear surface plate 61C according to the third embodiment. The rear surface plate 61D has a flat plate shape and exhibits a rectangular shape in front view. Further, the rear surface plate 61D partially has the cutout L, and a portion cut out through the cutout L is pushed out forward to form the connecting part 62D. As illustrated in FIG. 10(*b*), the connecting part 62D is inclined to extend diagonally forward and downward from the rear surface plate 61D, and a distal end portion thereof is hung on the linear heat-generating element forming the accommodating portion 41 of the basket filament-type heater 4 from above. When the connecting part 62D is hung on the accommodating portion 41, the rear surface plate 61D is connected to the basket filament-type heater 4 through intermediation of the connecting part 62D. Therefore, the rear surface plate 61D is supported by the accommodating portion 41 under a state of being arranged at a position on the rear side of the accommodating portion 41, and the heat from the basket filament-type heater 4 is transmitted to the rear surface plate 61D through the connecting part 62D.

Further, as is well illustrated in FIG. 10(*b*), the upper plate 63D is coupled to an upper end of the rear surface plate 61D, and the lower plate 64D is coupled to a lower end of the rear surface plate 61D. The upper plate 63D extends forward from the upper end of the rear surface plate 61D and covers the accommodating portion 41 from an upper side. Further, the lower plate 64D extends forward from the lower end of the rear surface plate 61D and covers the accommodating portion 41 from a lower side. Thus, in the fourth embodiment, the rear side, the upper side, and the lower side of the accommodating portion 41 are surrounded by the reflective plate 6D. The upper plate 63D and the lower plate 64D are each coupled to the rear surface plate 61D as described above. Therefore, the heat from the basket filament-type heater 4 is transmitted also to the upper plate 63D and the lower plate 64D through the rear surface plate 61D.

In the vertical vapor deposition device 1 including the reflective plate 6D having the above-mentioned configuration, of the vapor generated from the vapor deposition material V in the accommodating portion 41, the vapor that has traveled forward is brought into contact with the vapor deposition surface S of the substrate W and cooled with the vapor deposition surface S to be coagulated at that position. Further, the vapor that has traveled backward is reflected from or re-evaporated on the rear surface plate 61D of the reflective plate 6D arranged on the rear side of the accommodating portion 41. The vapor that has been reflected from or re-evaporated on the rear surface plate 61D inverts the traveling direction thereof and travels forward. Then, the vapor is brought into contact with the vapor deposition surface S of the substrate W and cooled with the vapor deposition surface S to be coagulated at that position. Further, the vapor that has traveled upward from the accommodating portion 41 is reflected from or re-evaporated on the upper plate 63D of the reflective plate 6D arranged on the upper side of the accommodating portion 41. The vapor that has been reflected from or re-evaporated on the upper plate 63D changes the traveling direction thereof and travels forward. Then, the vapor is brought into contact with the vapor deposition surface S of the substrate W and cooled with the vapor deposition surface S to be coagulated at that position. Further, the vapor that has traveled downward from the accommodating portion 41 is reflected from or re-evaporated on the lower plate 64D of the reflective plate 6D arranged on the lower side of the accommodating portion 41. The vapor that has been reflected from or re-evaporated on the lower plate 64D changes the traveling direction thereof and travels forward. Then, the vapor is brought into contact with the vapor deposition surface S of the substrate W and cooled with the vapor deposition surface S to be coagulated at that position. Minute solid particles that have been coagulated on the vapor deposition surface S are uniformly vapor-deposited on the vapor deposition surface S, to thereby form a thin film on the vapor deposition surface S.

As described above, also in the fourth embodiment, of the vapor generated from the vapor deposition material V, the vapor traveling in a plurality of directions (forward, backward, upward, and downward) contributes to vapor deposition on the vapor deposition surface S of the substrate W. That is, the vapor traveling in the plurality of directions contributes to vapor deposition. As a result, the yield of the vapor deposition material can be further improved.

Fifth Embodiment

Next, a vapor deposition device according to a fifth embodiment of the present disclosure is described. The vapor deposition device according to the fifth embodiment is different from that of the first embodiment described above in the shape of the filament-type heater and the arrangement and shape of the reflective plate, and the other configuration of the vapor deposition device according to the fifth embodiment is the same as that of the first embodiment described above. Therefore, different points are mainly described, and description of the other configuration is omitted.

Figure 11:
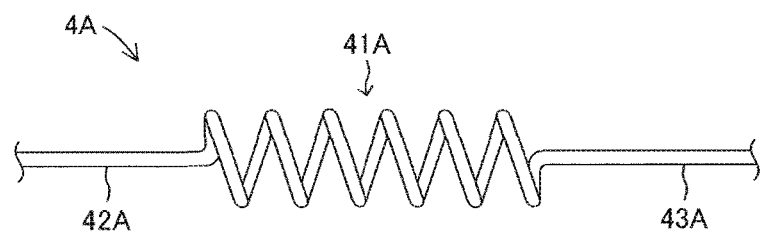
FIG. 11 is a front view of a coil filament-type heater.

In the fifth embodiment, a coil filament-type heater is used as the filament-type heater. FIG. 11 is a front view of a coil filament-type heater 4A to be used in the fifth embodiment. The coil filament-type heater 4A includes an accommodating portion 41A to be formed into a cylindrical shape by bending the linear heat-generating element into a helical shape, a first straight-line portion 42A connected to one end portion of the cylindrical accommodating portion 41A, and a second straight-line portion 43A connected to the other end portion of the cylindrical accommodating portion 41A. The vapor deposition material is accommodated in the accommodating portion 41A.

Further, the coil filament-type heater 4A is arranged in the vacuum tank 2 so that the center axis direction of the cylindrical accommodating portion 41A is parallel to the width direction. The first straight-line portion 42A is connected to the positive terminal 5a of the power supply 5, and the second straight-line portion 43A is connected to the negative terminal 5b of the power supply 5.

Figure 12:
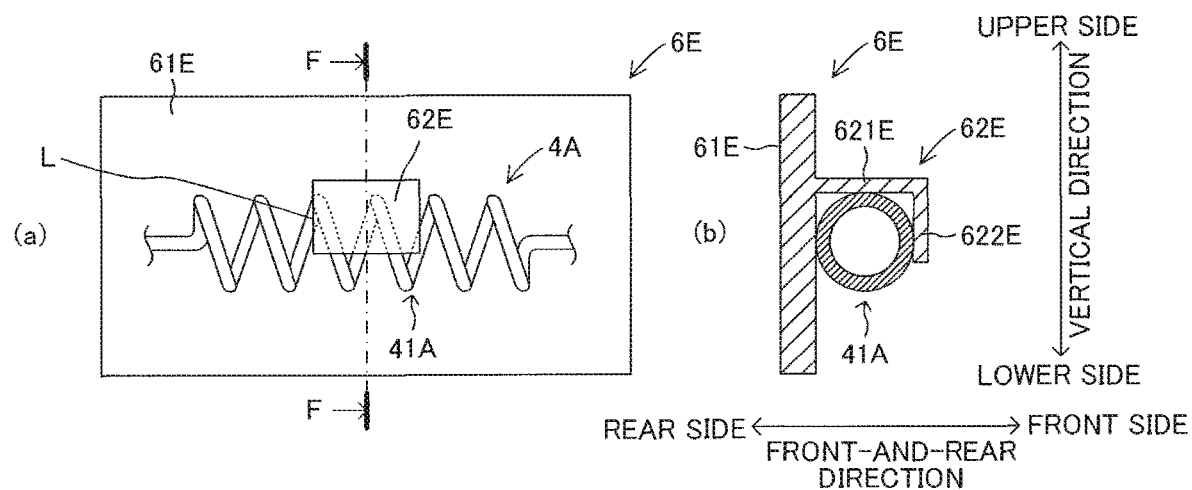
FIG. 12 are each views for illustrating the coil filament-type heater having a reflective plate of a fifth embodiment of the present disclosure mounted thereon.

Further, in the fifth embodiment, a reflective plate 6E is mounted on the coil filament-type heater 4A having the above-mentioned shape. FIG. 12 are each views for illustrating the coil filament-type heater 4A having the reflective plate 6E mounted thereon. FIG. 12(a) is a front view of the coil filament-type heater 4A when viewed from the front side, and FIG. 12(b) is a sectional view taken along the line F-F of FIG. 12(a). In FIG. 12(b), the right-and-left direction corresponds to a front-and-rear direction of the coil filament-type heater 4A, with the right side being a front side and the left side being a rear side. As illustrated in FIG. 12, the reflective plate 6E includes a rear surface plate 61E and a connecting part 62E.

The rear surface plate 61E is arranged on the rear side of the accommodating portion 41A of the coil filament-type heater 4A, and a contour thereof has a rectangular shape in front view. Further, the rear surface plate 61E partially has a cutout L, and a portion cut out through the cutout L is pushed out forward to form the connecting part 62E.

As illustrated in FIG. 12(b), the connecting part 62E includes a first part 621E that extends forward from the rear surface plate 61E and a second part 622E that extends downward from a distal end (front end) of the first part 621E, and is formed into a hook-like shape (L shape) in cross section when viewed from the direction of FIG. 12(b). The connecting part 62E is hung on the accommodating portion 41A so that the first part 621E is brought into contact with an upper surface of the accommodating portion 41A and the second part 622E is brought into contact with a front surface of the accommodating portion 41A. When the connecting part 62E is hung on the accommodating portion 41A, the rear surface plate 61E is connected to the coil filament-type heater 4A through intermediation of the connecting part 62E. Therefore, the rear surface plate 61E is supported by the accommodating portion 41A under a state of being arranged at a position on the rear side of the accommodating portion 41A, and the heat from the coil filament-type heater 4A is transmitted to the rear surface plate 61E through the connecting part 62E.

In the vapor deposition device including the reflective plate 6E having the above-mentioned configuration, of the vapor generated from the vapor deposition material V in the accommodating portion 41A, the vapor that has traveled forward is brought into contact with the vapor deposition surface S of the substrate W and cooled with the vapor deposition surface S to be coagulated at that position. Further, the vapor that has traveled backward is brought into contact with and reflected from the rear surface plate 61E of the reflective plate 6E arranged on the rear side of the accommodating portion 41A, or is re-evaporated on the rear surface plate 61E. The vapor that has been reflected from or re-evaporated changes the traveling direction thereof and travels forward. Then, the vapor is brought into contact with the vapor deposition surface S of the substrate W and cooled with the vapor deposition surface S to be coagulated at that position. Minute solid particles that have been coagulated on the vapor deposition surface S are uniformly vapor-deposited on the vapor deposition surface S, to thereby form a thin film on the vapor deposition surface S.

As described above, of the vapor generated from the vapor deposition material V, the vapor traveling in the (forward) direction toward the substrate and the vapor traveling in the (backward) direction opposite to the direction toward the substrate contribute to vapor deposition on the vapor deposition surface S of the substrate W. That is, the vapor traveling in a plurality of directions contributes to vapor deposition. As a result, the yield of the vapor deposition material can be improved.

EXAMPLES

Example 1

Solid indium was accommodated in an accommodating portion of a basket filament-type heater made of tungsten. Further, the reflective plate 6A (material: molybdenum) of the first embodiment was arranged at a position on the rear side of the solid indium in the accommodating portion. Then, an indium thin film was vapor-deposited on the surface (vapor deposition surface) of a substrate made of a resin through use of a vertical vacuum vapor deposition device.

Example 2

Solid indium was accommodated in the accommodating portion of the basket filament-type heater made of tungsten.

Further, the reflective plate 6B (material: molybdenum) of the second embodiment was mounted on the basket filament-type heater. Then, an indium thin film was vapor-deposited on the surface (vapor deposition surface) of the substrate made of a resin through use of the vertical vacuum vapor deposition device.

Example 3

Solid indium was accommodated in the accommodating portion of the basket filament-type heater made of tungsten. Further, the reflective plate 6B (material: tungsten) of the second embodiment was mounted on the basket filament-type heater. Then, an indium thin film was vapor-deposited on the surface (vapor deposition surface) of the substrate made of a resin through use of the vertical vacuum vapor deposition device.

Example 4

Solid indium was accommodated in the accommodating portion of the basket filament-type heater made of tungsten. Further, the reflective plate 6B (material: tantalum) of the second embodiment was mounted on the basket filament-type heater. Then, an indium thin film was vapor-deposited on the surface (vapor deposition surface) of the substrate made of a resin through use of the vertical vacuum vapor deposition device.

Example 5

Solid indium was accommodated in the accommodating portion of the basket filament-type heater made of tungsten. Further, the reflective plate 6C (material: molybdenum) of the third embodiment was mounted on the basket filament-type heater. Then, an indium thin film was vapor-deposited on the surface (vapor deposition surface) of the substrate made of a resin through use of the vertical vacuum vapor deposition device.

Example 6

Solid indium was accommodated in the accommodating portion of the basket filament-type heater made of tungsten. Further, the reflective plate 6D (material: molybdenum) of the fourth embodiment was mounted on the basket filament-type heater. Then, an indium thin film was vapor-deposited on the surface (vapor deposition surface) of the substrate made of a resin through use of the vertical vacuum vapor deposition device.

Comparative Example 1

Solid indium was accommodated in the accommodating portion of the basket filament-type heater made of tungsten without arranging a reflective plate. Then, an indium thin film was vapor-deposited on the surface (vapor deposition surface) of the substrate made of a resin through use of the vertical vacuum vapor deposition device.

Example 7

Solid indium was accommodated in an accommodating portion of a coil filament-type heater made of tungsten. Further, the reflective plate 6E (material: molybdenum) of the fifth embodiment was mounted on the coil filament-type heater. Then, an indium thin film was vapor-deposited on the surface (vapor deposition surface) of the substrate made of a resin through use of the vertical vacuum vapor deposition device.

Comparative Example 2

Solid indium was accommodated in an accommodating portion of a coil filament-type heater made of tungsten without arranging a reflective plate. Then, an indium thin film was vapor-deposited on the surface (vapor deposition surface) of the substrate made of a resin through use of the vertical vacuum vapor deposition device.

In Table 1, the kind of the filament-type heater to be used, the presence or absence of the reflective plate, and the material as well as the form and arrangement of the reflective plate in each of Examples are shown. In the column of the form and arrangement of the reflective plate in Table 1, numbers of the above-mentioned embodiments and drawings, in which the form and arrangement of the reflective plate are described, are shown. Further, the vertical vacuum vapor deposition device used in each of the above-mentioned Examples is Model No. VRD500ADP1 manufactured by ShinMaywa Industries, Ltd. Further, in each of Examples, film-forming conditions (film-forming time, vacuum degree in the vacuum tank, heating temperature of the filament-type heater, and the like) are the same.

TABLE 1

| | Kind of filament-type heater | Form and arrangement of reflective plate | Material for reflective plate | Vapor deposition material |
|---|---|---|---|---|
| Example 1 | Basket filament | First embodiment (FIGS. 5) | Molybdenum (Mo) | Indium (In) |
| Example 2 | | Second embodiment (FIGS. 8) | Molybdenum (Mo) | |
| Example 3 | | | Tungsten (W) | |
| Example 4 | | | Tantalum (Ta) | |
| Example 5 | | Third embodiment (FIGS. 9) | Molybdenum (Mo) | |
| Example 6 | | Fourth embodiment (FIGS. 10) | Molybdenum (Mo) | |
| Comparative Example 1 | | Absent | | |
| Example 7 | Coil filament | Fifth embodiment (FIGS. 12) | Molybdenum (Mo) | |
| Comparative Example 2 | | Absent | | |

Further, the film thickness of the indium thin film formed in each of Examples was measured through use of a quartz vibrating film thickness meter (XTCS-1000 manufactured by INFICON Co., Ltd.). Then, the film thickness ratio in each of Examples was calculated. In this case, the film thickness ratio refers to the ratio of the film thickness measured in Examples when the film thickness measured in Comparative Examples is defined to be 100. Further, in Examples 1 to 6, the film thickness ratio when the film thickness of Comparative Example 1 was defined to be 100 was calculated. In Example 7, the film thickness ratio when the film thickness of Comparative Example 2 was defined to be 100 was calculated. Further, in each of Examples, the temperature of the surface (vapor deposition surface) of the substrate during film formation was measured through use of a contact-type thermometer (DP-500 manufactured by RKC INSTRUMENT INC.). In Table 2, the film thickness ratio calculated in each of Examples and the measurement results of the substrate surface temperature are shown.

TABLE 2

|  | Film thickness ratio | Substrate surface temperature |
| --- | --- | --- |
| Example 1 | 169 | 51° C. |
| Example 2 | 163 |  |
| Example 3 | 161 |  |
| Example 4 | 165 |  |
| Example 5 | 193 |  |
| Example 6 | 222 | 53° C. |
| Comparative Example 1 | 100 | 50° C. |
| Example 7 | 171 | 57° C. |
| Comparative Example 2 | 100 | 55° C. |

As shown in Table 2, in any of Examples, it is understood that the thin film having a thickness of 1.5 times or more compared to that of Comparative Examples was formed. From this, it is understood that the yield of the vapor deposition material can be improved by arranging the reflective plate in any of the first to fifth embodiments.

Further, according to the first to fifth embodiments, the reflective plate is heated with the heat of the filament-type heater. However, when the heat of the reflective plate is transmitted to the substrate to excessively heat the substrate, there is a risk in that the substrate may be thermally degraded. In particular, when the reflective plate is arranged at a position close to the substrate, there is a high risk in that the substrate may be thermally degraded with the heat of the reflective plate. For example, when the heated reflective plate is arranged so as to surround a space extending from the vapor deposition material to the substrate as in Patent Literatures 1 and 2, that is, when the heated reflective plate is arranged on the front side of the vapor deposition material when viewed from the substrate, there is a risk in that the substrate may be heated with the heat of the reflective plate to be thermally deformed. In this respect, according to the first to fifth embodiments, the heated reflective plate is arranged on the rear side of the vapor deposition material, that is, at a position away from the substrate when viewed from the vapor deposition material. In other words, in the first to fifth embodiments, the heated reflective plate is not arranged on the front side of the vapor deposition material when viewed from the substrate, and hence the heat of the reflective plate is less liable to be transmitted to the substrate. Therefore, as shown in Table 2, in each of Examples, the substrate surface temperature during film formation is from about 50° C. to about 60° C., and is equal to or less than the thermal deformation temperature of a general resin substrate. As a result, the thermal degradation of the substrate with the heat of the reflective plate can be effectively prevented.

The various embodiments and Examples of the present disclosure have been described above, but the present disclosure should not be construed as being limited to the above-mentioned embodiments and Examples. For example, in each of Examples described above, the basket filament-type heater and the coil filament-type heater are used as the filament-type heater, but the present disclosure can be applied to any filament-type heater that is formed of a linear heat-generating element and includes an accommodating portion formed by bending the linear heat-generating element. Further, in each of Examples described above, the material for the filament-type heater is tungsten, but the filament-type heater may also be made of other materials that can be used as a heater. As described above, the present disclosure can be modified without departing from the scope and spirit of the present disclosure.

The invention claimed is:

1. A vapor deposition device, comprising:
a retaining portion, which is configured to retain a substrate;
a heater, including a heat-generating element which is configured to generate heat through application of a current, and including an accommodating portion to allow a vapor deposition material to be accommodated, the heater being arranged so that the accommodating portion is positioned at a predetermined distance in a horizontal direction of the heater from the substrate retained on the retaining portion; and
a reflective plate, which is arranged in the accommodating portion on a rear side of the vapor deposition material accommodated in the accommodating portion, when viewed from the substrate retained on the retaining portion, and which is constructed so as to receive heat from the heater,
wherein the accommodating portion has a conical shape having a contour that protrudes downward by winding the heat-generating element into a helical shape, and
wherein the reflective plate has a semi-conical shape and is arranged in the accommodating portion to protrude downward.

2. A vapor deposition device according to claim 1, wherein the reflective plate includes a rear surface plate arranged on a rear side of the accommodating portion when viewed from the substrate retained on the retaining portion.

3. A vapor deposition device according to claim 2, wherein the reflective plate includes an upper plate arranged on an upper side of the accommodating portion and a lower plate arranged on a lower side of the accommodating portion.

* * * * *